(12) United States Patent
Nagel

(10) Patent No.: US 11,464,116 B2
(45) Date of Patent: Oct. 4, 2022

(54) LITHOGRAPHIC EXPOSURE SYSTEM AND METHOD FOR EXPOSURE AND CURING A SOLDER RESIST

(71) Applicant: Limata GmbH, Ismaning (DE)

(72) Inventor: Matthias Nagel, Poing (DE)

(73) Assignee: LIMATA GmbH, Ismaning (DE)

( * ) Notice: Subject to any disclaimer, the term of this patent is extended or adjusted under 35 U.S.C. 154(b) by 1111 days.

(21) Appl. No.: 16/071,171

(22) PCT Filed: Jan. 20, 2017

(86) PCT No.: PCT/EP2017/051209
§ 371 (c)(1),
(2) Date: Jul. 19, 2018

(87) PCT Pub. No.: WO2017/125560
PCT Pub. Date: Jul. 27, 2019

(65) Prior Publication Data
US 2021/0092850 A1 Mar. 25, 2021

(30) Foreign Application Priority Data

Jan. 20, 2016 (EP) .................... 16152127

(51) Int. Cl.
*H05K 3/06* (2006.01)
*G03F 7/20* (2006.01)
*H05K 3/00* (2006.01)

(52) U.S. Cl.
CPC ............ *H05K 3/06* (2013.01); *G03F 7/2053* (2013.01); *H05K 3/0082* (2013.01); *H05K 2203/108* (2013.01)

(58) Field of Classification Search
CPC ........ H05K 3/06; H05K 3/0082; H05K 3/064; H05K 2203/108; H05K 2203/107;
(Continued)

(56) References Cited

U.S. PATENT DOCUMENTS

| 7,892,837 B2 | 2/2011 | Koenig et al. |
| 2005/0169326 A1 | 8/2005 | Jacob et al. |

(Continued)

FOREIGN PATENT DOCUMENTS

| CN | 1653185 A | 8/2005 |
| CN | 1837961 A | 9/2006 |

(Continued)

OTHER PUBLICATIONS

International Search Report and Written Opinion for International Application No. PCT/EP2017/051209, dated Apr. 26, 2017, 11 pages.

(Continued)

*Primary Examiner* — Minh N Trinh

(74) *Attorney, Agent, or Firm* — Westman, Champlin & Koehler, P.A.

(57) ABSTRACT

A lithographic exposure system and method for exposing and structuring a substrate coated with a solder resist is provided. The lithographic exposure system having at least one light beam, formed preferably by two or more laser beams of different UV wavelengths, which is deflected relative to the substrate by a variable deflection device, in order to generate structures on the substrate. In particular, the light beam is superimposed, spatially in the image plane and temporally in the exposure, by a spatially limited, high-energy, preferably externally mounted heat source, wherein preferably infrared laser diodes having linear optics are used.

13 Claims, 3 Drawing Sheets

(58) Field of Classification Search
CPC .......... H05K 2203/0505; G03F 7/2053; C12Q 1/6886; C12Q 2600/156; C12Q 2600/158
USPC ............................ 29/832–841; 430/311–319
See application file for complete search history.

(56) References Cited

U.S. PATENT DOCUMENTS

| | | |
|---|---|---|
| 2006/0141624 A1 | 6/2006 | Koenig et al. |
| 2006/0215139 A1 | 9/2006 | Oshida et al. |
| 2006/0215143 A1* | 9/2006 | Yamaguchi ......... G03F 7/70466 355/69 |
| 2021/0092850 A1* | 3/2021 | Nagel .................. H05K 3/0082 |

FOREIGN PATENT DOCUMENTS

| | | |
|---|---|---|
| CN | 1837962 A | 9/2006 |
| DE | 10 2006 006 797 A1 | 9/2006 |
| DE | 10 2013 021 513 A1 | 6/2015 |
| EP | 2 871 525 A2 | 5/2015 |

OTHER PUBLICATIONS

Office Action, for Chinese Patent Application No. 201780007345.1, dated May 28, 2020, 3 pages.
Search Report, for Chinese Patent Application No. 201780007345.1, dated May 20, 2020, 2 pages.

* cited by examiner

LITHOGRAPHIC EXPOSURE SYSTEM AND METHOD FOR EXPOSURE AND CURING A SOLDER RESIST

CROSS-REFERENCE TO RELATED APPLICATION

This Application is a Section 371 National Stage Application of International Application No. PCT/EP2017/051209, filed 20 Jan. 2017, and published as WO 2017/125560 A1 on 27 Jul. 2017, in German, the contents of which are hereby incorporated by reference in their entirety.

FIELD OF THE INVENTION

The present invention generally relates to an exposure device, in particular a direct exposure device or lithographic exposure device for directly exposing a substrate coated with a photosensitive layer in order to manufacture a printed circuit board, i.e., a PCB, or a photo-etched part, and to the corresponding method for exposing substrates with the direct exposure device according to the present invention. In particular, the invention relates to an exposure device having at least one UV light beam which is deflected relative to the substrate by a variable deflection device in order to generate structures in the photosensitive layer. Preferably, the light beam is formed by two or more laser beams having different UV wavelengths. In particular, the light beam is superimposed, in the image plane in terms of space and in the exposure in terms of time, by a spatially limited, preferably externally mounted heat source, wherein preferably infrared laser diodes (IR laser diodes) having linear optics are used as the heat source.

BACKGROUND OF THE INVENTION

A printed circuit board (PCB) is a carrier or substrate made of an insulating material comprising firmly adhering conductive connections. A printed circuit board is used to mechanically fasten and electrically connect electronic components. The connecting lines (tracks) are typically produced by mask etching (etched wiring board=EWB) from a thin layer of a conductive material, for example copper, on an insulating substrate (the so-called base material).

When producing wiring structures or connecting lines by means of mask etching, a circuit pattern is usually provided on a masking. A photosensitive layer (photoresist or photosensitive resist) that is applied onto a board blank provided with a conductive coating is exposed through the masking whereby the circuit pattern is transferred from the masking to the photoresist.

The property of the photoresist is modified by the exposure to UV light such that the exposed and unexposed structures are differently soluble by a developer fluid. Thus, after exposing the photoresist through the mask comprising the desired PCB layout, either the exposed or the unexposed portions of the resist can be solved and eliminated in a suitable developer solution depending on the photoresist used. Upon putting the thus treated printed circuit board into an appropriate etching solution (e.g., ferric chloride or sodium persulfate dissolved in water or with hydrochloric acid+$H_2O_2$), only the exposed part of the metalized surface is attacked; the portions covered by the photoresist are preserved since the resist is resistant to the etching solution.

Once the tracks of the printed circuit board have been formed, a solder resist is applied. The solder resist of a finished printed circuit board should preferably be structured such that it covers the tracks and leaves only the soldering points bare. This solder resist is often formed as a green resist layer on the printed circuit board. As synonyms for the term solder resist, also the terms solder mask or solder stop mask are used. The solder resist permits, for example, to avoid soldering defects; when wave soldering is performed, tin is saved and the tracks are protected against corrosion. By means of a physical process (hot air leveling), the soldering points that remain bare (pads and lands) can be coated with a tin layer and additionally with a flux, which permits an improved soldering process.

Solder resists can be generally divided into two groups, which can be characterized by the application method. The solder resist is applied either in a structured way or over the entire surface area with a subsequent structuring operation by means of photometric processes.

In the structured screen printing method, for example, the solder resist is pressed by means of a squeegee through a screen. Furthermore, it is increasingly also possible to print liquid resists onto the printed circuit board by means of direct printing methods, for example by inkjet printing.

According to the second method, the solder resist is applied over the surface area of the printed circuit board by means of spraying, curtain coating, roller coating or any other coating operation. The structuring of the solder resist, i.e., the formation of a pattern, is subsequently effected by means of exposure. In particular, the respective solder resists are so-called photostructurable solder resists (LPI, liquid photoimageable solder masks). Typically, photoimageable solder masks are viscous liquids or photopolymer films in the sort of dry films. Once they have been applied, they are preferably dried, exposed and subsequently developed.

Preferably, the solder resist is irradiated with or exposed to UV light of one or more wavelengths. During the exposure of solder resists, the exposed areas are modified by the exposure such that they survive a subsequent developing process. These solder resists are often referred to as UV-curable solder resists.

According to a first embodiment, non-exposed areas of the solder resist can be washed away and/or dissolved away by a developer fluid. According to another embodiment, the exposed areas of the solder resist, the exposed areas of the solder resist can be washed away and/or dissolved away by a developer fluid.

After a subsequent thermal baking process, the solder resist left over on the printed circuit board prevents the components placed on the board from flowing away during the subsequent reflow soldering process. The solder resist also protects the etched circuit structures as well as the base material against external influences. Furthermore, it is possible to use specific colors of solder resist to thus control the properties of the PCB, e.g. the improved reflection of light.

The exposure and resultant curing of the solder resist by means of a mask is known from the state of the art (mask exposure; often also referred to as contact exposure). This solder resist curing by means of a mask method is advantageous in view of speed. Generally, high doses of light intensities in the UV wavelength range of 350 nm-450 nm are required for the solder resist exposure. The UV lamps or UV light sources have been specifically doped in the conventional mask method in order to be able to achieve sufficient light power in this spectral range for the exposure. A disadvantage of these high-energy UV light sources was high power losses. Typical torch lamps or contact exposure apparatuses require a connection power of more than 15 kWh, wherein the main energy is in the infrared (IR) spectral range even after the torch doping. It is aimed at minimizing this IR energy as far as possible since it heats the imaging medium, the mask, and the medium expands or may change due to this heating. Hence, an indefinable non-linear scaling of the mask ensues and thus imaging defects of the solder resist image ensue. The structure size, for example, changes and entails defects in the design of the printed circuit board; furthermore, the non-linear scaling adversely affects the fitting accuracy of the solder resist to be exposed with respect to the already structured track. Despite numerous measures to eliminate the IR spectrum, the printed circuit boards and the masks heat during the exposure of solder resists in the contact exposure apparatus, in particular during the exposure of high-energy solder resists, e.g., of the color white. For this reason, the first contact exposure apparatuses have been equipped with UV LED sources that do not possess an IR spectrum any longer. The above described effects of the quality degradation of the exposure in the mask method are thereby excluded.

Direct exposure is an alternative to the mask method. Direct exposure possesses the property that in contrast to conventional mask exposure, the structures to be exposed can be introduced without an imaging means (mask) by various direct structuring methods. The advantage of this technology resides in the rapidness of the treatment without any dead time when manufacturing the setup materials (e.g., masks) as well as in an increased resolution quality and registration quality. A laser direct exposure method, for example, is known from the prior art; the laser beam is deflected in said method by means of galvano-scanner mirror methods as well as polygon scanning methods. Besides, there are methods which are based on light modulators comprising micromirror technologies in use with laser or light-emitting diodes.

The direct exposure of solder resists in the prior art is performed using UV lasers or UV light-emitting diodes, which can only achieve a high output power in the image field of the exposure when they are numerously cascaded. In particular, it is known from the prior art that the output power of one individual UV LED or laser diode is too low for achieving rapid UV polymerization of the solder resist. Therefore, several diodes are interconnected (cascaded) in the prior art to achieve a sufficiently high energy density. However, since an individual laser diode is expensive, the UV direct exposure becomes too expensive and thus no longer economical in the case of too high cascading.

Besides, other lasers emitting light in the UV range are also expensive so that an exposure to UV light having a high light intensity is either expensive and rapid or cheap and slow. Moreover, not all direct exposure technologies are able to transfer unlimited light power into the image plane since power loss in optical elements may entail high temperature influences and thus a short lifetime of the components.

Therefore, solutions are needed that reduce the energy required for exposure of the solder resist from a technical and economic point of view.

The object is achieved by a method according to the present invention as well as a device according to the present invention, which are defined in the claims.

According to a first aspect, the present invention relates to a direct exposure device for the direct, preferably maskless, exposure and curing of a desired structure in a UV curable resist, preferably a solder resist. The device according to the present invention can be used, for example, also for the exposure of a liquid polymer compound that is curable with UV light.

Preferably, the present invention can also be used for legend printing. Legend printing is a method of labeling or marking a printed circuit board. In the prior art, the legend is usually printed by means of screen printing. For prototypes or small batches, however, there are also methods which are similar to inkjet printing. According to the present invention, it is also possible to use a UV curable resist for legend printing. Usually, the contours of the components are printed to facilitate the manual assembly and thus to avoid errors. The individual components are often also numbered consecutively in order to be able, for example during subsequent repair work, to find them with the aid of the circuit diagram. White and yellow are the colors that are the most commonly used as printing colors but in principle other colors are conceivable as well.

The direct exposure device according to the present invention preferably comprises at least one exposure device which comprises at least one UV laser light source for generating a UV laser light beam. Additionally, the direct exposure device according to the present invention preferably comprises a deflection device which is configured to deflect the UV laser light beam to an exposure plane in order to expose and preferably cure the desired structure in a resist, preferably a solder resist, arranged in the exposure plane. The direct exposure device comprises a heat source device that is configured such that an area in the exposure plane is exposed, in a way overlapping in terms of space and preferably in terms of time, to the deflected UV laser light beam and to the heat radiation emitted by the heat source device.

Preferably, the direct exposure device additionally comprises an accommodation device for accommodating a coated substrate. Preferably the substrate is coated with a UV curable solder resist. Moreover, it is preferred that the direct exposure device comprises at least one movement device for generating a relative movement between the at least one exposure device and the substrate.

The at least one exposure device preferably comprises at least two UV laser light sources, preferably at least two UV laser diodes, which emit UV laser light in preferably two different wavelengths in the range of 350 nm-450 nm. However, the invention is not limited to two UV laser diodes, i.e., it is also possible that a plurality of the same and/or different UV laser diodes are provided. According to the present invention, coupling optics may be used which are configured to combine light of a plurality of UV laser light sources in order to direct the combined UV laser light via the deflection device onto the exposure plane, in particular the solder resist.

Preferably, the heat source device comprises at least one IR laser which is coupled to the direct exposure device such that preferably a substantially fixed exposure area is generated in the exposure plane. Preferably, the IR laser exposes, on the exposure area, an IR exposure area having a specific geometric form, for example a quadrilateral, a parallelogram, a trapezoid, a rectangle or an oval or a circle. Furthermore, it is preferred that the laser light of the UV laser light sources is deflected by the deflection device onto the exposure plane such that each spot exposed to the UV laser light beam at the same time is exposed to the IR light. In other words, the light of the UV laser light sources is preferably deflected such that the spots exposed in the exposure plane are within the exposure area of the IR laser.

According to a further preferred embodiment, the exposure area can also be modified, e.g., enlarged, reduced and/or shifted, during the UV laser light exposure whereby, as the case may be, an exposure area is obtained that is optimized in response to the UV laser exposure.

According to a further preferred embodiment, the direct exposure device can comprise a device for providing an inert gas directly above the exposure plane, preferably above the exposure area.

Moreover, the present invention is in particular characterized by the method according to the present invention for direct, preferably maskless, exposure of a desired structure in a UV curable resist. In particular, the exposure according to the present invention causes an effective exposure along with more efficient curing of a solder resist. The method according to the present invention preferably comprises the following steps: generating a UV laser light beam with an exposure device and deflecting the UV laser light beam onto an exposure plane in which the solder resist is located in order to expose the desired structure in the solder resist (UV exposure). Besides, it is preferred that heat radiation from a heat source device is directed onto the solder resist at the same time as the UV exposure takes place, in particular in such a way that the UV-exposed sites are exposed at the same time to UV and heat radiation. In other words, the emitted heat radiation overlaps in terms of space and time with the UV laser light beam deflected onto the exposure plane, whereby the deflected UV laser light beam hits an area of the solder resist that has been heated by the emitted heat radiation.

The heat radiation is preferably IR light which is preferably emitted by an IR laser which preferably generates a substantially geometrically fixed exposure area in the exposure plane, wherein the deflected UV laser light beam is preferably deflected within this fixed exposure area exposed to IR light.

Preferably, the UV laser light beam comprises at least two, preferably three, different wavelengths in the UV range, preferably in the range of 350 nm-450 nm.

Moreover, it may be advantageous to provide an inert gas directly above the exposure plane during the UV exposure.

Generally, the object of the present invention can be achieved in particular in that the UV exposure or UV curing of the solder resist is supported by selectively introduced heat.

Generally, some manufacturers of solder resists recommend that the maximum temperature during the exposure should not exceed 35° C. Moreover, in a precision tool, such as a direct exposure device, a general heat introduction necessarily entails that the environmental temperature is heated as well and thus entails undesired thermal expansion effects in the device itself, e.g. the setup of the direct exposure device which comprises, e.g., metal or aluminum parts. Thus, general heating over the entire surface area should be avoided or rather affects adversely the environment and thus the precision of the application. Also the general heating of the printed circuit board, onto which the solder resist to be structured is applied, by means of heating elements likewise leads to undesired expansion effects. These effects, where necessary, could be corrected or compensated for by non-linear scaling of the data for the direct exposure so that, in the case of a registration process taking place prior to the actual exposure process, expansion effects are selectively identified and compensated for. However, this is only possible for a process or situation which is stable in terms of temperature and involves deviations of only a few degrees.

Furthermore, in addition to the preferred precision of direct exposure it is further preferred to achieve a high throughput amount, i.e., the exposure of a printed circuit board coated with a solder resist should require as little time as possible. All-over heating a board (standard size 610 mm×457 mm) that is laminated with copper and coated with a solder resist, using a not too aggressive temperature profile in order to avoid considerable distortion, would require too long a time period. Moreover, the all-over heating operation will considerably depend on the material thickness as well as the copper thickness so that a preliminary examination of the exact board parameters would be necessary, which in practice with setup tolerances of the galvanic processes partly are too high in the manufacturing tolerances.

The new method according to the present invention as explained here combines the maskless property of the direct exposure of printed circuit boards comprising solder resists with the high-precision and high-energy line heating by means of an IR laser, preferably by means of an IR laser having a specific spectrum. The IR laser according to the present invention is preferably arranged as an external component at an exposure device, preferably in the form of a multi-head system, and thus achieves a kind of "catalyst" effect of the UV multi-wavelength polymerization running parallel to the line heating process. The method according to the present invention is characterized in particular by the selective heating without any further external environmental impact on the optical and mechanical components of the exposure apparatus as well as without surface heating of the carrier material. Additionally, the method according to the present invention is preferably independent of the height (thickness) of the copper lamination.

In the illustrated method configuration with a laser exposing device of the linear type, the UV polymerizing laser beam modulated according to the conductive pattern is all over superimposed by the external IR line laser beam and thus creates a limited, strongly heated and short-time ideal environmental condition for the polymerization of the solder resist.

The effect of the IR light is rapidly and precisely emitted onto the small line section for a short time without any further negative influences which, as described above, are inevitable in the case of other methods.

A relevant effect of the IR radiation can be achieved at energy inputs of 0.3 $W/mm^2$ at line lengths of 80 mm and line widths of 1-2 mm. The UV energy previously required without IR heating for the required final polymerization decreases by various factors depending on the resist system to be processed. The following table shows the effect of IR radiation according to the present invention at an energy density of 0.4 $W/mm^2$ in the case of different resists. In particular, the required UV energy was determined with respect to a desired "gray scale value" which corresponds to a defined gray scale value according to a known gray scale wedge. Stouffer gray scale wedges (for example T2115), for example, provide a respective gray scale value classification.

| Resist system: | Resist color: | Required UV energy without IR irradiation Stouffer 10 clear | Required UV energy with IR irradiation of 0.4 $W/mm^2$ Stouffer 10 clear |
|---|---|---|---|
| Sun Chemicals XV Series | blue | 600 $mJ/cm^2$ | 220 $mJ/cm^2$ |
| Huntsmen Probimer | green | 700 $mJ/cm^2$ | 250 $mJ/cm^2$ |
| Peters Elpemer GL 2467 | green | 400 $mJ/cm^2$ | 200 $mJ/cm^2$ |

It could be demonstrated that the energy limitation with high edge definition and/or the area performance distribution of the heating is transferred by the optical components to the carrier board so that the IR radiation only acts or can act exactly at these sites.

SUMMARY OF THE INVENTION

The direct exposure device according to the present invention comprises an exposure device for exposing a substrate comprising a photosensitive layer (for example a solder resist). The exposure device comprises at least one light source for emitting light in the UV wavelength range, preferably in the range between 350 nm-450 nm, i.e., preferably in the wavelength range in which the photosensitive layer is sensitive. Preferably, the light is generated with one or more UV laser diodes and/or semiconductor lasers.

In particular, the direct exposure device according to the present invention is a maskless direct exposure device by means of which patterns and/or structures can be exposed due to the deflection of the laser light beam directly onto the substrate, preferably the solder resist, during the exposure.

The invention generally relates to a direct exposure device for the lithographic direct, preferably maskless, exposure and curing of a pattern and/or structure in a solder resist that cures in the UV range of 350 nm-450 nm. The direct exposure device comprises at least one exposure device, preferably a plurality of exposure devices, wherein each exposure device preferably comprises a modulatable light source comprising one or more UV laser light sources for generating UV laser light, preferably in the wavelength range of 350 nm-450 nm, more preferably at a wavelength of 375 nm, 395 nm and/or 405 nm. Preferably, the UV laser light is collimated within and/or outside of the exposure device in order to obtain a collimated laser light. The collimation is performed, for example, by means of coupling optics. Besides, the direct exposure device also comprises a modifiable deflection device that is appropriate to expose the pattern on the substrate by deflecting the UV laser light, preferably by deflecting the collimated UV laser light.

A modifiable deflection device can preferably deflect light incident on the deflection device in response to a time control in different angles. To this end, in the simplest case a mirror can be used which can be displaced or is adjustable/modifiable around an axis. Preferably, however, a mirror can be adjustable and/or rotatable around at least two axes, i.e., two planes. According to further preferred embodiments, it is also possible to use a plurality of modifiable mirrors for deflecting the light. A modifiable deflection device within the meaning of the present invention can also be implemented by devices that are not mechanically modifiable but only modify the reflection behavior. For example, an accusto-optic modulator (AOM) can be used by means of which both the intensity and the frequency of laser beams can be modulated. It is likewise possible to change the direction of the laser beam by means of an AOM.

As a further exemplary type of application within the meaning of the present application, the modifiable deflection device can be configured with at least one rotating and/or tiltable polygon mirror in order to deflect the UV laser light at different positions on the substrate. According to a further embodiment, the modifiable deflection device can comprise a one-dimensional or two-dimensional glavanometer scanner.

As a further exemplary type of application within the meaning of this invention, imaging can be performed through micromirror arrangements on the basis of semiconductors.

Moreover, it is preferred that the light source and/or the laser diode is modulatable, i.e., it can preferably be switched to both 0% and 100% and further preferably to any intermediate levels of its performance. This enables, for example, better imaging of edges and oblique paths true to their contours.

According to a further preferred embodiment, the exposure device can additionally be attached to a movement device, wherein the movement device generates a relative movement between the exposure device and the substrate. Preferably, however, the substrate is fixed relative to its surroundings and the movement device moves the exposure device relative to the substrate. In the following, the flat substrate is to be in an XY-plane, wherein the exposure device can be moved by the movement device preferably in a plane parallel to the XY-plane (preferably, the X-axis and the Y-axis are perpendicular to each other). Further preferably, the exposure device can also be moved by the movement device along a Z-axis perpendicular to the XY-plane (preferably parallel to the gravitational force). In other words, the movement device is preferably adapted to enable a relative movement in one dimension, preferably parallel to the substrate or perpendicular to the substrate, and/or to enable a relative movement in two dimensions, preferably parallel to the substrate, and/or to enable a relative movement in three dimensions, preferably parallel and perpendicular to the substrate.

According to a preferred embodiment, the exposure device comprises at least two UV laser light sources, preferably at least two UV laser diodes. Moreover, it is preferred that two UV laser light sources or UV laser diodes emit laser light of different wavelengths, wherein both wavelengths are preferably in the range of 350 nm-450 nm. However, it is also possible that two UV laser light sources or UV laser diodes emit light in the same wavelength; this can be advantageous, for example, in order to increase the performance of the laser light sources or UV laser diodes. Besides, it is also possible to provide more than two UV laser light sources or UV laser diodes, wherein preferably at least two or more light sources emit light in different wavelengths.

For the purpose of exposing the desired pattern on the substrate in a desired size, it is possible that additionally an image processing device for image processing measures is provided so that the pattern to be exposed can be modified and/or corrected on the substrate by means of scaling, rotation, displacement and/or tilting.

For the purpose of providing an accurate and safe exposure, the light beams of the plurality of light sources, preferably of the UV laser light sources or UV laser diodes, are combined according to the present invention into a common light beam by means of an optical element. This common light beam can then be directed onto the substrate by means of the modifiable deflection device as if the beam comes from a single light source.

It is preferred that only one side, preferably the top, of the substrate to be exposed is exposed to the direct exposure device. According to a further preferred embodiment, it is also possible that two sides, for example the top and the bottom or the right side and the left side, of the substrate are exposed. For example, at least one exposure device can be arranged above the substrate and at least one exposure device can be arranged below the substrate, wherein the two exposure devices can preferably be moved separately from each other.

In addition to the above discussed device, the invention also relates to a method for lithographic direct, preferably maskless, exposure of a pattern on a substrate that comprises a photosensitive layer in the UV range of 350 nm-450 nm, comprising the step of providing a direct exposure device comprising at least one exposure device which comprises a modulated light source with one or more UV laser light sources, preferably for generating a collimated UV laser light in the wavelength range of 350 nm-450 nm. Subsequently, the substrate is arranged relative to the direct exposure device such that the UV laser light emitted by the exposure device can be directed onto the substrate. Then, the substrate is exposed to the exposure device, wherein the pattern is achieved on the substrate by means of a modifiable deflection device by deflecting and/or modulating the UV laser light in a way variable in terms of time.

The distance between the exposure device and the substrate can preferably be modified during the exposure, whereby the extension of an exposure spot generated on the substrate preferably changes, whereby lines of different widths are exposed on the substrate.

The variable deflection device deflects the light preferably in the two dimensions to the substrate, wherein the deflection operation variable in terms of time is preferably carried out with two identical oscillation frequencies to scan parallel lines at 45°, whereby the scanning speed can be increased by the factor of √2. In other words, the deflection speed of the scanners can be increased in that they do not work at 90° relative to the movement direction of linear mechanics (a fast scan axis and a slow scan axis) but scan both at 45° at the same speed. Relatively, the laser spot moves faster by this way of operation but it also requires more laser power for curing correspondingly.

The speed of the movement device for generating a relative movement between the exposure device and the substrate is preferably adapted to the scanning speed of the variable deflection device so that the relative movement of the exposure device to the substrate is performed as a function of the scanning speed.

The variable deflection device has a first mirror stage in the form of a galvanometer mirror preferably for a deflection along a Y-axis, which is in the plane of the substrate, and a second mirror stage preferably in the form of a one-dimensional electrically-magnetically oscillating micromirror preferably for a deflection along an X-axis, which is in the plane of the substrate and perpendicular to the Y-axis.

According to a further preferred embodiment, the first and/or the second mirror stage can preferably be configured in the form of a polygon scanner operating one-dimensionally or two-dimensionally.

According to a further preferred embodiment, the first and/or the second mirror stage can be preferably configured in the form of a one-dimensional or two-dimensional galvanometer mirror.

According to a further preferred embodiment, the first and/or the second mirror stage can be preferably configured in the form of a one-dimensional or two-dimensional MEM mirror (micro-electromechanical mirror; MEM). MEMs are electromechanically operating mirror systems consisting of microscopically small mirrors switching the light beam in optical switches.

According to a further preferred embodiment, the first and/or the second mirror stage can be preferably configured in the form of a microscanner or microscanning mirror. A microscanner is a micro-opto-electromechanical system (MOEMS) of the class of the micromirror actors for dynamically modulating light. Depending on its design, the modulatingly acting movement of an individual mirror can take place in a translatory way or in a rotating way around one or two axes. In the first case, a phase-shifting effect is achieved, in the second case, the deflection of the incident light wave is achieved.

Preferably, the exposure device is arranged in multiple applications in juxtaposition relative to each other such that during the scanning operation a continuous line is achieved that is multiplied by the number of exposure devices. If, for example, the exposure units can be mounted by a particularly integrated design such that, for example, in the case of four units, the individual scanning areas are seamlessly lined up side by side, a continuous scanning line is achieved. In the normal way of operation applied so far, this is not possible which is the reason why at least two runs (back and forth) have to be carried out.

Preferably, the exposure device is provided with beam expanding optics in order to expand the UV laser light, preferably the collimated UV laser light, to a larger, defined diameter.

Preferably, the one or more UV laser diodes can be modulated analogously electrically, preferably as a function of the gray scale values of the image of a feed source.

According to a further preferred embodiment, the one or more UV laser diodes can be modulated electrically digitally, preferably as a function of the gray scale values of the image of the feed sources.

Finally, an adaptation of the individual images can preferably be performed according to the present invention in the feed source prior to the exposure operation by overlapping of projected individual images and/or by blackening or non-exposure of projecting edge areas.

For the purpose of the above described way of operation, the direct exposure device according to the present invention comprises a preferably externally attached component for heat introduction into the image plane in a way limited in terms of space and synchronized in terms of time by means of preferably infrared semiconductor high-energy diodes having linear optics by superimposing the UV polymerizing light beams with the homogeneous heating area. Preferably, the infrared laser is attached to the direct exposure device at an angle of inclination by means of a fiber feed.

Preferably, the collimated IR laser beam is transformed in an area of preferably 2 mm in width and 80 mm in line length by homogenization optics, preferably microlens arrangements as well as linear optics.

In order to achieve the described "catalyst effect" of the UV exposure by means of the line heating according to the present invention, it is preferred that the IR laser beam is guided onto the resist plane with a high area irradiation performance According to the present invention, correspondingly high area performances are preferably achieved by linear optics having a focal point. The present invention preferably uses linear optics having a focal width in the range of 200-300 mm, preferably 240 to 320 mm, for example about 280 mm, in order to generate a preferably high-energy exposure area in line form that is as homogeneous as possible.

According to a preferred embodiment, the homogeneous irradiance is firstly achieved by a homogenization of the laser source, wherein preferably an arrangement of microlenses is used. Preferably, the microlenses have a pitch of few mm, preferably less than 10 mm or less than 5 mm, preferably about 1.3 mm Subsequently, the light is focused preferably by means of an arrangement of focal and/or linear lenses, whereby, for example, a line having a width of 80 mm and a height of preferably about 2 mm is generated on the resist to be exposed. As a function of the speed of the direct exposure by means of UV light, the width and/or the height of the IR light exposure area can also be larger or smaller. For example, widths between 40-160 mm or between 60-100 mm are preferred. The preferred heights of the exposure area are preferably in the range between 1-5 mm, preferably 1-3 mm, more preferably about 2 mm.

Preferably, an almost rectangular intensity profile (top hat) is generated within the line (width); whereas preferably a Gaussian intensity profile is imaged in the height of the line (see FIG. 3).

The inventors of the present invention found out that a combination of a high-energy laser source in the IR range, a homogenization stage and a subsequent focusing or linear stage can generate an intensity profile of the IR exposure area that provides a high and simultaneously high-quality homogeneous line heating in order to influence the UV exposure of the carrier material in the preferred way, i.e., in order to achieve the "catalyst effect".

Besides, it has turned out that spot intensity profiles, i.e., an inhomogeneous IR light intensity within the exposure area should be avoided. For example, spot intensity profiles, which occur, for example, when light is guided from one or more fiber optic decouplings directly onto a substrate (for example, when a plurality of decouplings are arranged in juxtaposition in the form of a line), do not create sufficiently homogeneous as well as intensity-relevant imaging and/or heating with sufficiently high edge definition. Besides, in the case of fiber decoupling, the exit angle of the radiation from the fiber physically has a typical numerical aperture of 0.2 and higher values so that the fiber outputs would have to take place few mm over the resist to be exposed in order to achieve theoretically any noteworthy heating within the meaning of the present invention at all. In practice, this is not possible in order to achieve a rapid UV exposure according to the present invention. An inclination of the fiber exit areas towards the substrate to be exposed is just as impossible as too large a distance to the substrate.

The system of the UV exposure according to the present invention preferably operates with exposure units which are positioned preferably in a parallelized way on a two-axis portal arrangement. The UV exposure is preferably performed in a limited exposure area, for example in an area between 60-100 mm, preferably in an exposure area having a width/height of about 80 mm.

The IR light line heating should be limited according to the present invention preferably with high edge definition to the area of the UV exposure, whereby "catalyst effects" in neighboring UV exposure areas can be reduced or suppressed. In particular, undesired "catalyst effects" in the neighboring regions can negatively influence the imaging quality in individual sections of the exposure. A possible "crosstalk" of a heating source of one exposure unit to a second exposure unit within the same axes and its exposure area can preferably be resolved and/or prevented by an external homogenization stage and/or focusing or linear stage.

Preferably, the UV line exposure should be positioned within the IR line exposure. External optical component assemblies should preferably be alignable in the X-, Y- and/or Z-position in order to be able to superimpose the focal planes of the UV exposure and/or the IR exposure. The alignment can preferably take place by means of an adjustment device, wherein the adjustment device is preferably designed mechanically such that it is manually adjustable, for example, by means of adjusting or setting screw mechanisms. According to a further embodiment, the adjustment device can also comprise mechanical-electrical mechanisms for the adjustment. Moreover, it is possible to use motor controls, sensors as well as feedback signal transmitters. It can also be preferred that one or more positions of the adjustment are electronically stored and subsequently merely adjusted to the preferred conditions.

In other words, it is particularly advantageous according to the present invention to mechanically couple an external optical component assembly to the UV exposure source for the purpose of homogenization and/or focusing of the heat irradiation (IR radiation). This provides, for example, the advantage that in the case of different carrier material thicknesses it is possible in an easy way to operate always in the focal range of both systems. It can thereby be achieved, for example, that the process can be carried out with constant process parameters.

Additionally, with the aid of the optics according to the present invention it is possible to adjust the point of the maximum IR performance intensity preferably onto the resist surface even in the case of different thicknesses of the underlying substrate. It is also possible to adjust the point of the maximum IR performance intensity onto the substrate copper area in order to individually regulate and/or adjust the "catalyst effect". This can preferably be performed by means of the adjustment device of the external optical component assembly, wherein the adjustment can be effected preferably mechanically manually and/or electrically in a motorized way.

Furthermore, the invention also relates to a mechanical alignment arrangement in the directions X and Y on the image plane as well as the focal width readjustment in Z and the rotational angle α of the line laser area.

According to a further preferred embodiment, the one or more IR laser diodes can be modulated electrically digitally, preferably as a function of the gray scale values of the image of the feed sources.

Eventually, for the purpose of high-precision heat dose introduction the heat source can be operated, on the one hand, via pulse width modulation as well as via the CW continuous wave method.

According to a further preferred embodiment, the heat source can be designed in a cascaded way, preferably be means of laser fiber coupling of several single-diode lasers, in the case of required relevant increases in performance.

According to a further preferred embodiment, the heat source of several infrared wavelengths can also be combined into preferably one individual beam and/or one individual area in order to be able to uniformly heat different resist levels in the case of thick resist layers.

Preferably variable lenses and/or optic elements can be introduced into the beam path or heat transmission channel in order to be able to dynamically adapt the spatial property of the heat distribution, heat area and focal plane within the image plane preferably in a way controlled by software.

BRIEF DESCRIPTION OF THE DRAWINGS

In the following, preferred embodiments of the present invention are described in detail with reference to the Figures, in which.

DETAILED DESCRIPTION OF PREFERRED EMBODIMENTS

Figure 1:
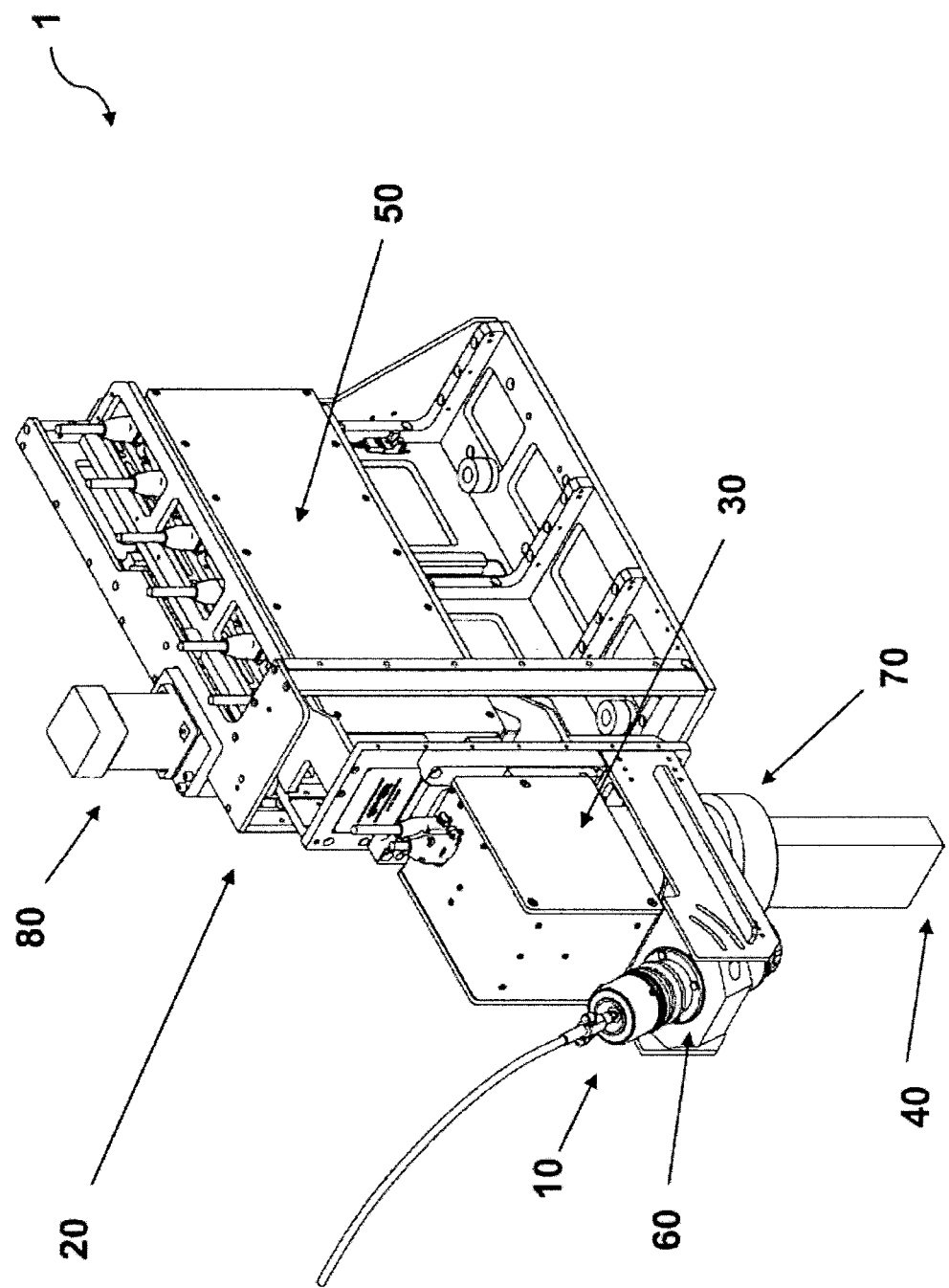
FIG. 1 shows a perspective view of a direct exposure device according to the present invention comprising an external heat source arrangement.

FIG. 1 shows a perspective view of a direct exposure device 1 (in the following also referred to as lithographic exposure device) comprising an exposure device 20 and an external heat source device 10. The heat source device 10 can be mounted to the exposure device 20, for example, via an adjustment device 60.

This assembly preferably comprises a laser diode module comprising coupling optics 50 with transmitting laser light beams in the ultraviolet spectral range of 350 nm-450 nm.

Preferably the coupling takes place within the laser module and is performed by optical elements from the prior art. To this end, for example, pole cubes and semipermeable mirrors as well as other combination optics are used. Preferably, lasers having discrete single-mode wavelengths with different main maxima are coupled or combined in the coupling optics 50. For example, the light beams of three laser sources with main maxima at about 375 nm, 390 nm and 405 nm can be coupled.

The individual beams and/or the coupled beams of the UV laser light sources, which preferably are laser diode sources, are imaged onto the exposure plane 40 by means of a deflection device (in the following also referred to as laser deflection device 30). Preferably, the area to be exposed is in the exposure plane 40 or substantially parallel to the exposure plane 40. Preferably, the solder stop coated area of a substrate or a printed circuit board 100 is to be exposed according to the present invention.

The laser deflection device 30 can be, for example, a galvano scanner comprising a mirror coating that reflects UV wavelengths and imaging preferably via an achromatic telecentric F-theta lens 70 onto the exposure plane 40 or the focal plane. The cuboid below the lens 70 illustrated in FIG. 1 represents the work area of the lens 70. According to a further preferred embodiment, the work area can also be smaller or larger and/or wider.

Figure 2:
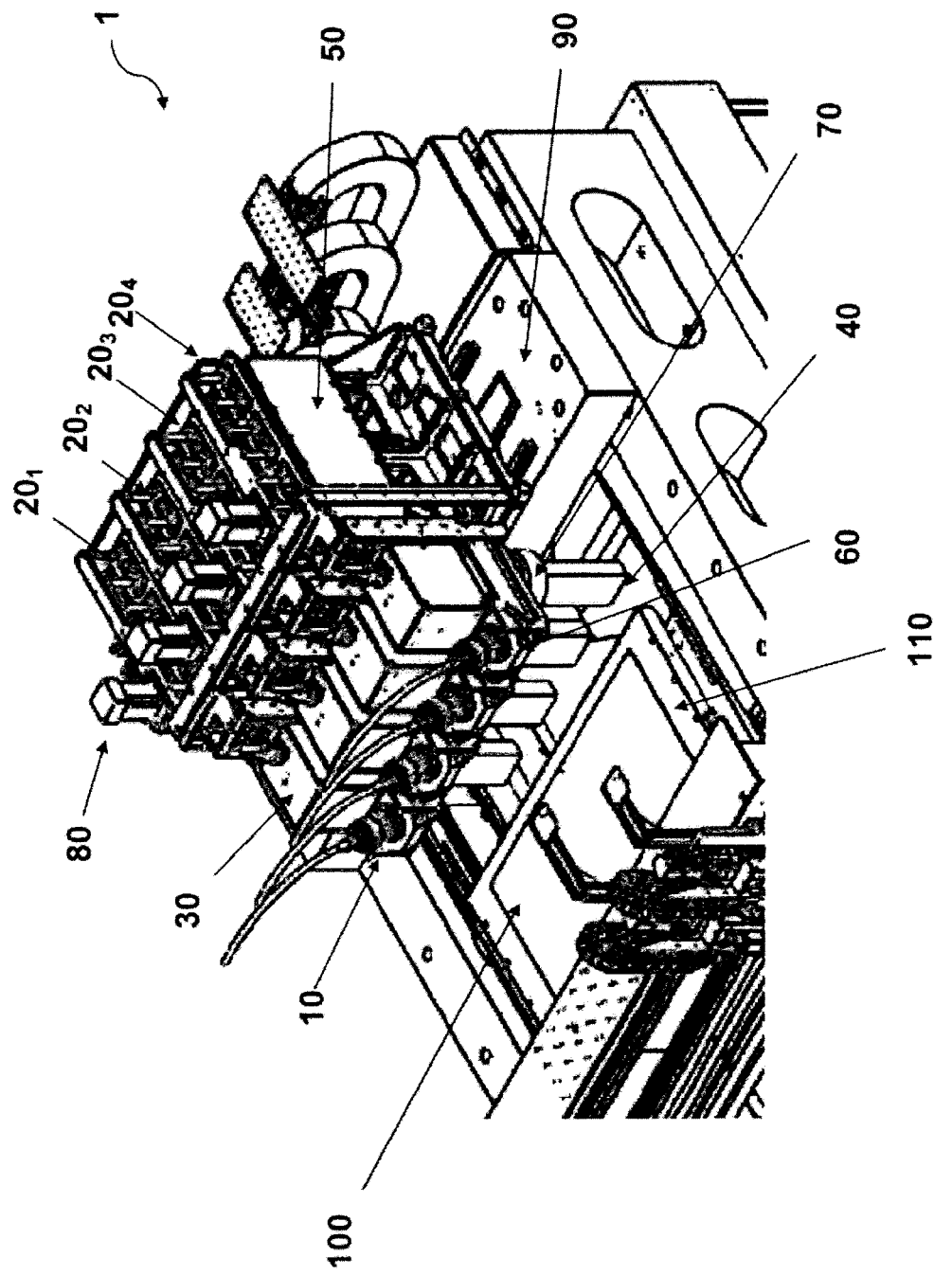
FIG. 2 shows a perspective view of a direct exposure device according to the present invention comprising an external heat source arrangement in the form of a two-axis portal arrangement comprising a four-level projection unit in the exposure device.

FIG. 2 shows a perspective view of a further direct exposure device 1 according to the present invention comprising four exposure devices $20_1$, $20_2$, $20_3$ and $20_4$. Each of these four exposure devices $20_X$ is additionally coupled to an external heat source device $10_X$, which in turn are mounted via respective adjustment devices $60_X$ to the exposure devices $20_X$.

Moreover, FIG. 2 illustrates the assembly of the exposure devices 20 to a movement device 90. By means of the movement device 90, a relative movement between the exposure device 20 and the substrate 100 to be exposed is generated, whereby it is possible to expose larger areas of a substrate 100.

The direct exposure device according to the present invention can alternatively or additionally comprise a second movement device 110. The second movement device 110 can preferably be configured as a vacuum table onto which the substrate 100 is attachable by means of an underpressure. The movement of the second movement device 110 can provide, for example, a movement in the XY-plane, preferably parallel to the exposure plane. The movement can be performed by means of an electric motor or electric motors, preferably by means of linear motors comprising corresponding guiding mechanisms. By means of the movement device or movement devices, the exposure devices 20 can move along the exposure plane in a cascading way, preferably in a cascading way in column form. In other words, a parallelization with a plurality of exposure devices is possible.

The focal plane or the exposure plane 40 can be readjusted by integrated servomotors 80 which permit a movement of the exposure devices 20 along the Z-axis. Preferably, an adjustment of the exposure plane 20 is performed prior to the exposure process.

Figure 3:
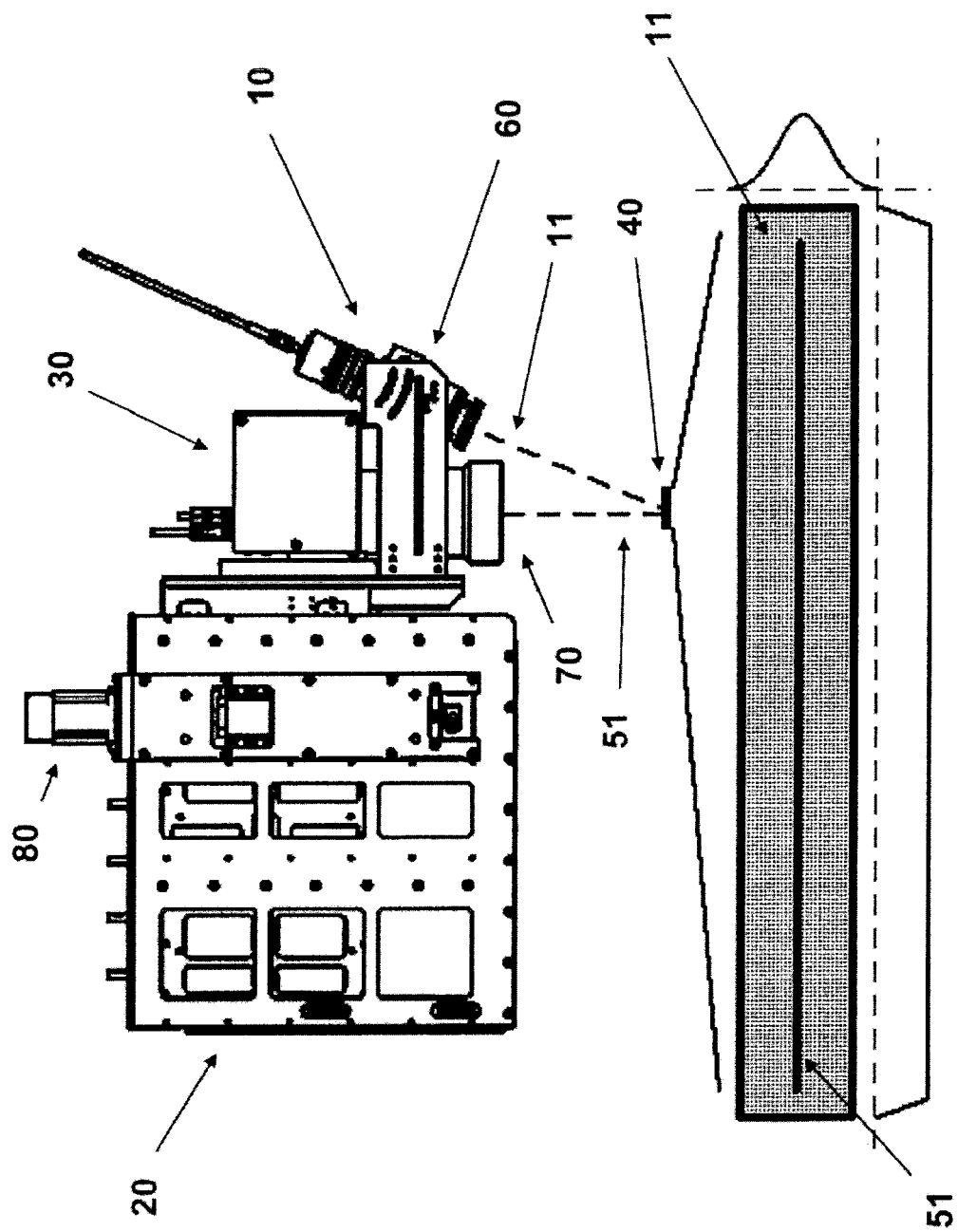
FIG. 3 shows a schematic illustration of the overlapping of the UV laser line of the exposure device comprising the line area of an external heat source arrangement.

FIG. 3 illustrates a schematic side view of an exposure device 20 comprising an external heat source arrangement 10 according to the present invention, wherein in this embodiment said heat source arrangement 10 is mounted to the exposure device 20 via an adjustment device 60.

In FIG. 3, the beam path 51 of the emitted UV laser beam on the exposure plane is purely schematically depicted in a way not true to scale. For example, the UV laser beam is deflected by means of the deflection device 30, which is preferably a galvano scanner system 30, along a line or column. According to the present invention, the beam path 51 is superimposed with the IR laser beam on the exposure plane. In particular, it is preferred that the light emitted by the heat source device 10 substantially represents a rectangular exposure area 11 on the exposure plane 40, and exhibits a Gaussian light intensity distribution along one direction.

The modulated and thus structuring UV laser beam line 51, preferably 1-6 beams having a typical laser line dimension of 80 mm in width and preferably 5-25 μm in height (FWHM, Gaussian intensity profile), is positioned directly centrically above the heat field 11 of the IR laser beam by means of the adjustment device 60.

The intensity profile of the heat field 11 thus formed is preferably rectangular, strongly sloping and preferably adapted by means of lens adjustments in two dimensions. Preferably, there is a top hat intensity profile distribution in the width as well as a Gaussian intensity profile distribution in the height. The heat field dimensions should be preferably configured larger than the UV laser beam line 51 both in the width and in the height. Preferably, a width of about 85 mm and a height of about 2 mm should be observed so that the temperature variation in the area of the UV laser beam line 51 is two-dimensionally homogeneously distributed.

REFERENCE SIGNS AND TERMS

1 Direct exposure device, lithographic exposure device (the entire system)
5. Solder resist
6 Substrate
7 Heat source device, heat source
11 Exposure area, heat field
20 Exposure device (the "laser system" comprising the UV lasers)
30 Deflection device, laser deflection device
40 Exposure plane, exposure plane (XY-plane)
50 Coupling optics
51 Beam path
60 Adjustment device
70 Lens
80 Servomotors
90 First movement device
100 Printed circuit board, substrate
110 Second movement device

The invention claimed is:

1. A lithographic exposure system for direct maskless exposure and curing of a desired structure in a solder resist, the direct exposure system comprising:
   at least one exposure device which comprises at least one ultraviolet (UV) laser light source for generating a UV laser light beam, and
   a laser deflection device which is configured to deflect the UV laser light beam to an exposure plane in order to expose the desired structure in the solder resist which is arranged in the exposure plane,
   wherein the lithographic exposure system further comprises a heat source device includes homogenization optical element for generating a homogeneous heat irradiation (IR) area on the solder resist, wherein the heat source device is configured such that an area in the exposure plane is exposed, in a way overlapping in terms of homogeneous space and time, to the deflected UV laser light beam and to the IR emitted by the heat source device, and
   the deflection device deflects the UV laser light beam in the two dimensions, wherein deflection operation variable in terms of time is carried out with two identical oscillation frequencies.

2. The lithographic exposure system according to claim 1, further comprising
   an accommodation device for accommodating a substrate coated with the solder resist, and
   at least one movement device for generating a relative movement between the at least one exposure device and the substrate.

3. The lithographic exposure system according to claim 1, wherein the at least one exposure device comprises at least two UV laser light sources, including at least two UV laser diodes, which emit UV laser light in at least two different wavelengths in a range of 350 nm-450 nm.

4. The lithographic exposure system according to claim 3, wherein the at least two UV laser diodes are configured to emit UV laser light in at least two different wavelengths in the range of 350 nm-450 nm.

5. The lithographic exposure system according to claim 1, wherein the heat source device comprises at least one IR laser which is coupled to the direct exposure device such that a substantially fixed exposure area is generated in the exposure plane and the UV laser light beam deflected by the deflection device is deflected within the exposure plane.

6. The lithographic exposure system according to claim 1, wherein the homogenization optical element is a microlens arrangement, configured to generate the homogeneous IR area irradiation on the solder resist.

7. The lithographic exposure system according to claim 1, further comprising an adjustment device configured to position of the IR exposure area on the solder resist can be adjusted.

8. The lithographic exposure system according to claim 1, wherein the exposure plane is further configured to provide an inert gas directly above the area of the exposure plane.

9. The lithographic exposure system according to claim 1, further comprising coupling optics which are adapted to combine light of a plurality of UV laser light sources to direct UV laser light via the deflection device onto the solder resist.

10. A method operatively associated with a lithographic exposure system for maskless exposure and curing of a desired structure in a solder resist, the method comprising the steps:
    providing an exposure device includes a heater source, a laser deflecting device,
    generating an ultraviolet (UV) laser light beam with the exposure device,
    deflecting the UV laser light beam by the laser deflecting device onto an exposure plane in which the solder resist is located in order to expose the desired structure in the solder resist,
    wherein the deflecting the UV laser light beam further comprises:
    emitting heat radiation of the heat source device onto the solder resist, wherein the heat source device comprises at least one homogenization optical element in order to generate a homogeneous IR area irradiation on the solder resist, wherein the emitted heat radiation overlaps in terms of homogeneous space and time with the UV laser light beam deflected onto the exposure plane, whereby the deflected UV laser light beam hits an area of the solder resist that has been heated by the emitted heat radiation, and
    the deflection device deflects the UV laser light beam in two dimensions, wherein the deflection operation variable in terms of time is carried out with two identical oscillation frequencies.

11. The method according to claim 10, wherein the generating the UV laser light beam comprises at least two or three different wavelengths in the UV range, in the range of 350-450 nm.

12. The method according to claim 10, wherein the emitting heat radiation is IR light which is emitted by an IR laser which generates a substantially geometrically fixed exposure area in the exposure plane, and the deflected UV laser light beam is deflected within this exposure area.

13. The method according to claim 10, wherein in the generating UV laser further comprising providing of an inert gas directly above the exposure plane during the UV exposure.

* * * * *